United States Patent
Manteghi

(10) Patent No.: US 6,177,726 B1
(45) Date of Patent: *Jan. 23, 2001

(54) $S_IO_2$ WIRE BOND INSULATION IN SEMICONDUCTOR ASSEMBLIES

(75) Inventor: Kamran Manteghi, Manteca, CA (US)

(73) Assignee: Philips Electronics North America Corporation, New York, NY (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/249,227

(22) Filed: Feb. 11, 1999

(51) Int. Cl.[7] .......................... H01L 21/44; H01L 23/30; H01L 29/40; H01L 23/40
(52) U.S. Cl. .......................... 257/725; 257/790; 257/784; 257/787; 257/788; 257/674; 257/687; 257/698; 257/669; 257/666; 257/692; 438/124; 29/588; 29/591
(58) Field of Search .......................... 257/734, 666, 257/669, 671, 674, 676, 678, 692, 698, 725, 729, 776, 783, 787, 788, 790, 687; 438/124, 106, 121; 29/588, 591; 361/392

(56) References Cited

U.S. PATENT DOCUMENTS

| | | | |
|---|---|---|---|
| 3,978,578 | * 9/1976 | Murphy ................................. | 438/114 |
| 4,486,945 | * 12/1984 | Aigoo ..................................... | 29/588 |
| 4,821,148 | * 4/1989 | Kobayashi et al. ................... | 361/392 |
| 5,176,310 | * 1/1993 | Akiyama et al. ................. | 228/180.5 |
| 5,208,467 | * 5/1993 | Yamazaki .............................. | 257/667 |
| 5,241,133 | * 8/1993 | Mullen, III et al. ................. | 174/52.4 |
| 5,331,205 | * 7/1994 | Primeaux .............................. | 257/790 |
| 5,345,106 | * 9/1994 | Doering et al. ....................... | 257/675 |
| 5,376,756 | * 12/1994 | Kwon ................................... | 174/52.4 |
| 5,386,342 | * 1/1995 | Rostoker .............................. | 257/790 |
| 5,390,082 | * 2/1995 | Chase et al. .......................... | 361/783 |
| 5,396,104 | * 3/1995 | Kimura ................................. | 257/784 |
| 5,414,928 | * 5/1995 | Bonitz et al. .......................... | 29/840 |
| 5,639,558 | * 6/1997 | Tatsumi et al. ...................... | 428/458 |
| 5,656,830 | * 8/1997 | Zechman .............................. | 257/784 |
| 5,710,457 | * 1/1998 | Uno ...................................... | 257/666 |
| 5,847,445 | * 12/1998 | Wark et al. .......................... | 257/669 |
| 5,854,512 | * 12/1998 | Manteghi ............................. | 257/735 |
| 5,880,520 | * 3/1999 | Ma ....................................... | 257/659 |
| 5,886,409 | * 3/1999 | Ishino et al. ......................... | 257/737 |
| 5,889,211 | * 3/1999 | Maudie et al. ........................ | 73/720 |
| 5,908,317 | * 6/1999 | Heo ..................................... | 438/617 |

\* cited by examiner

*Primary Examiner*—Alexander O. Williams
(74) *Attorney, Agent, or Firm*—Patrick T. King

(57) ABSTRACT

A semiconductor integrated circuit package is provided with insulated bonding wires. The semiconductor die is mounted to a base of either a leadframe or a grid-array package. A plurality of bonding wires are bonded between bonding pads on the semiconductor die and bonding fingers at inner ends of package conductors. The bonding wires have a PECVD $S_iO_2$ layer formed thereupon to thereby provide electrically-insulated bonding wires to prevent short-circuits between adjacent bonding wires. After wire bonding of the bonding wires, an insulating PECVD $S_iO_2$ layer is formed on the bonding wires to prevent short-circuits with adjacent wires. An $S_iO_2$ layer is simultaneously formed on a leadframe and is removed from the outer ends of the leads by blasting with a medium.

8 Claims, 4 Drawing Sheets

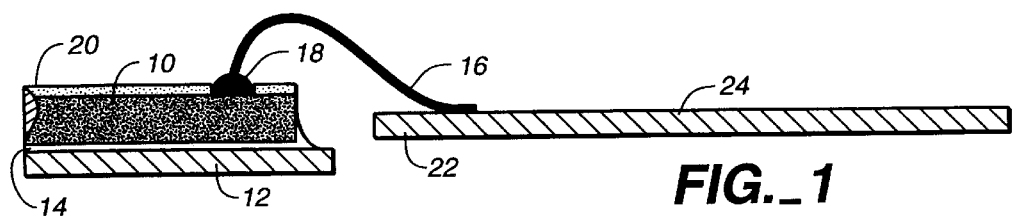
FIG._1
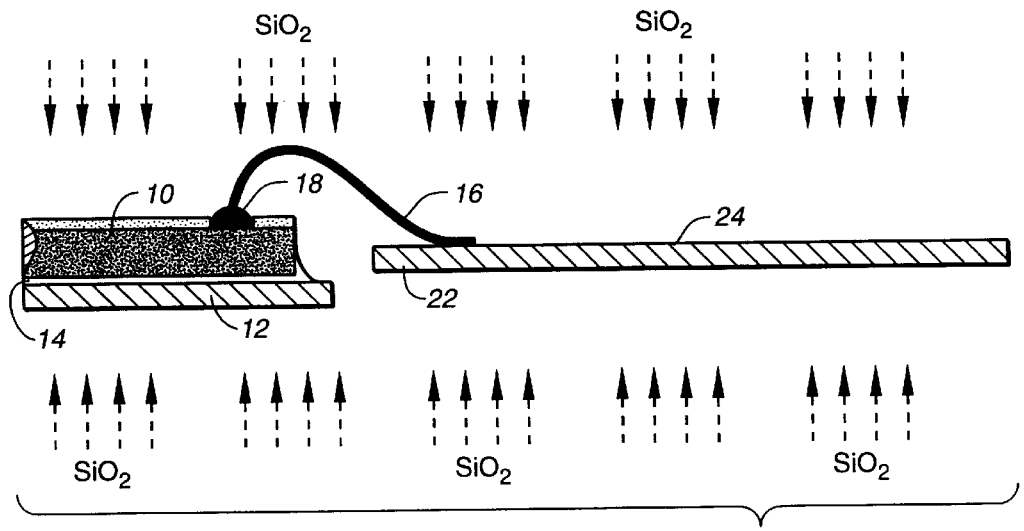
FIG._2
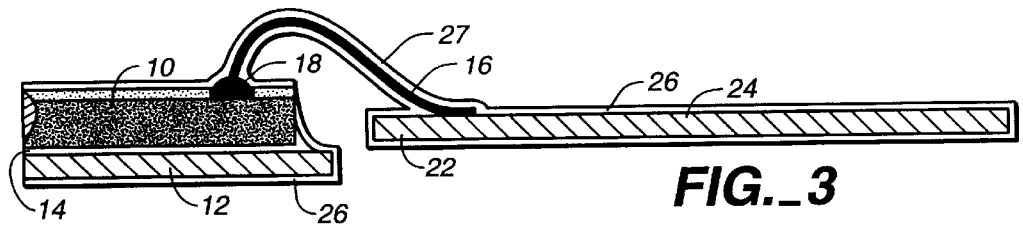
FIG._3
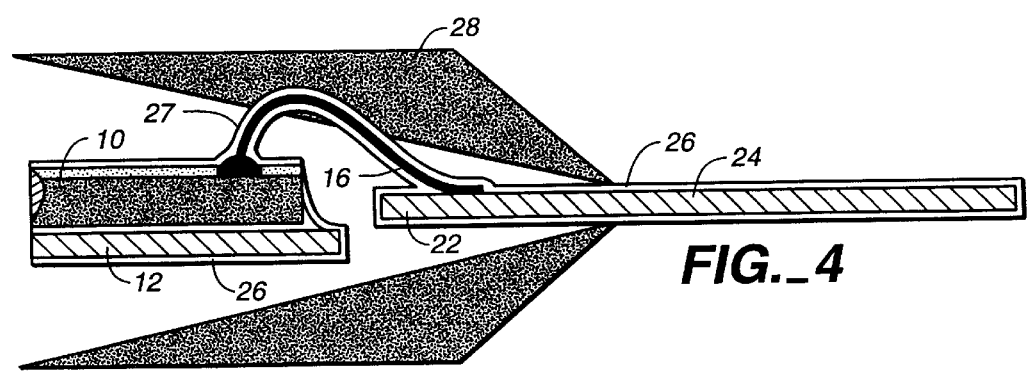
FIG._4

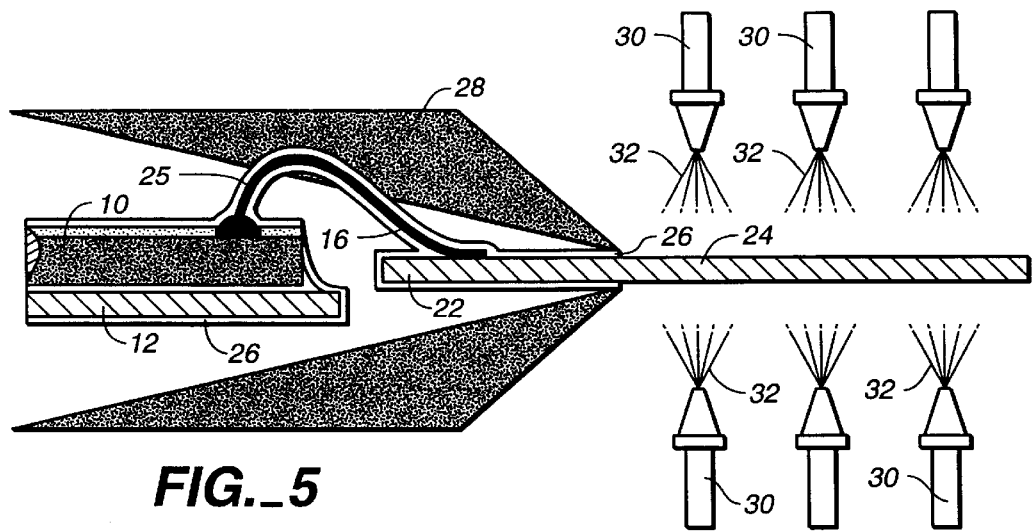
FIG._5
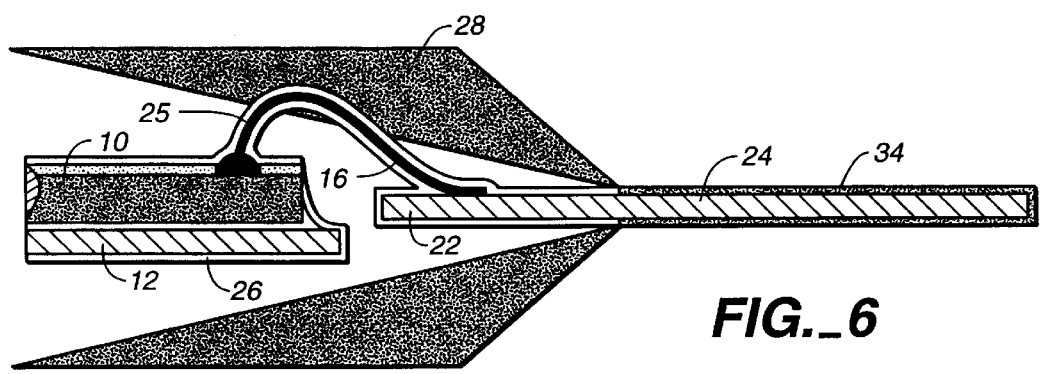
FIG._6
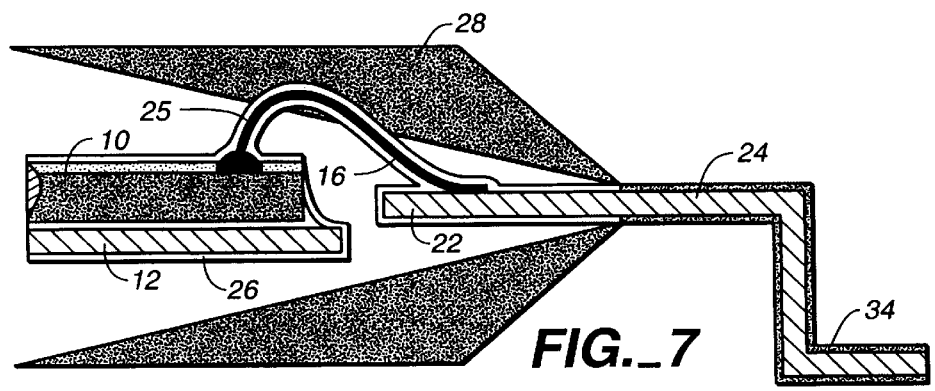
FIG._7

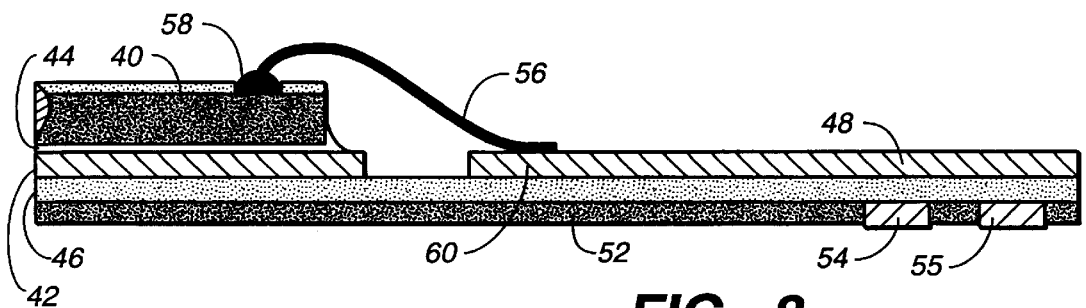
FIG._8
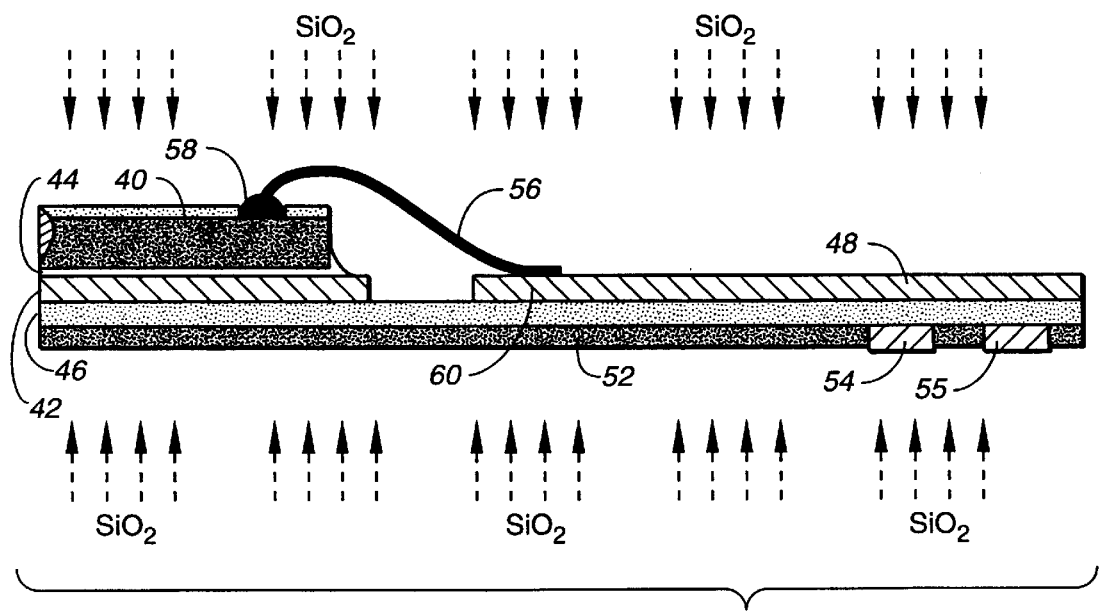
FIG._9
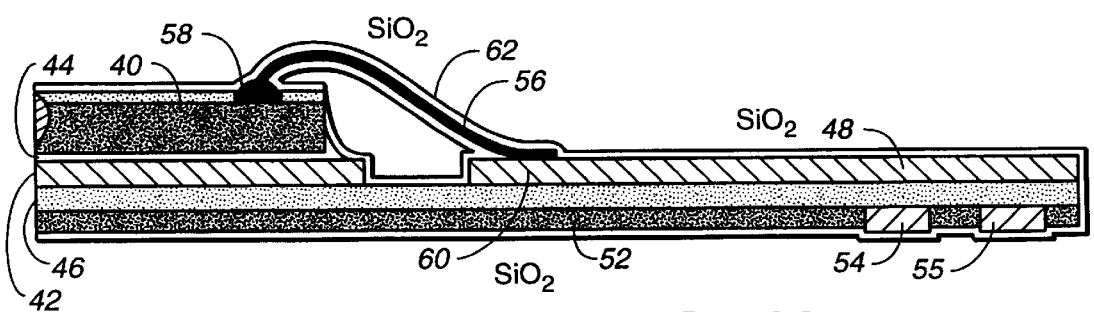
FIG._10

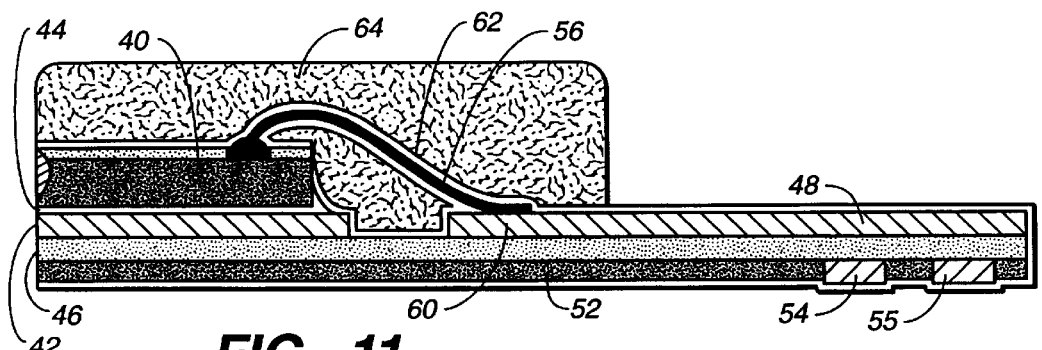
FIG._11
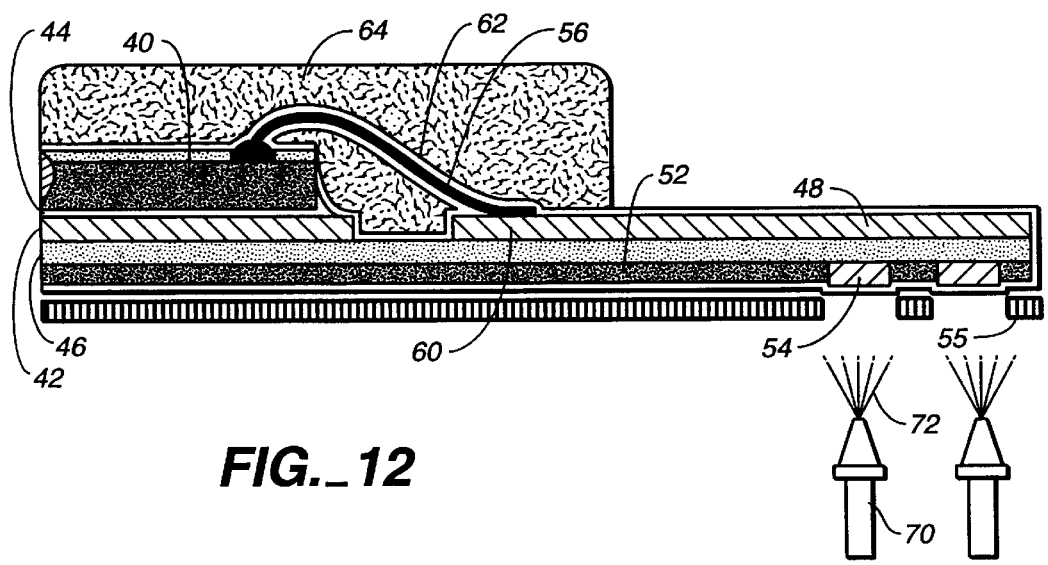
FIG._12
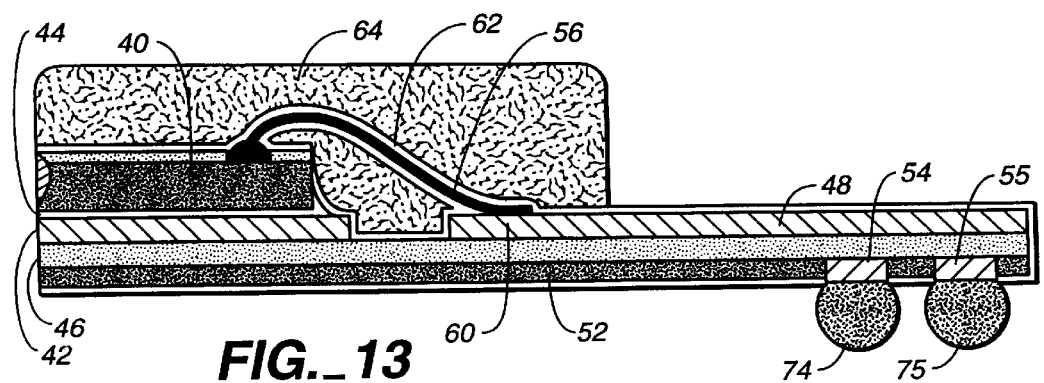
FIG._13

$S_iO_2$ WIRE BOND INSULATION IN SEMICONDUCTOR ASSEMBLIES

BACKGROUND OF THE INVENTION

1. Field of the Invention

This invention relates to packaging of semiconductor devices and, more particularly, to techniques for insulating bonding wires during assembly of an integrated-circuit package.

2. Prior Art

The trend in integrated circuit packaging is to have the spacing between bonding pads on an integrated circuit die become smaller so that the pitch of the bonding pads gets tighter. For this reason and for other reasons, such as this use of multiple bonding tiers, the length of the bonding wires in integrated circuit packages are getting longer and longer bonding wires have a tendency to electrically short-circuit together.

Various attempts have been made to electrically insulate bonding wires to avoid having adjacent wires touching each other and electrically short-circuit. One technique provides insulation on the wires prior to wire bonding. Insulating the bonding wires prior to bonding created problems such as modification of wire-bonding machines, increased costs, decreased yields, and charring of the insulation material which contaminates the integrated-circuit die.

Another technique provides for coating the bonding wires with a silicone spray after wire bonding. Using this so-called "wet" technique, the sprayed silicone material can get on the leadframe or substrate on which the die is mounted. During encapsulation of the die and bonding wires, this silicone material causes a loss of adhesion of the encapsulating material to the leadframe or substrate. This silicone spray also prevents good adhesion of plating materials on the leadframe.

Consequently, a need exists for a dry technique for electrically insulating bonding wires to prevent electrical short circuits therebetween.

SUMMARY OF THE INVENTION

It is therefore an object of the invention to provide a technique for providing electrical insulation to the bonding wires of an integrated-circuit package after wire-bonding and during assembly of the package to prevent electrical short circuits between adjacent bonding wires in the integrated-circuit package.

In accordance with these and other objects of the invention, a semiconductor integrated-circuit die is singulated and die-attached to a leadframe or a substrate. Wire bonds are formed between the die and the package leads using aluminum or copper bonding wires. Next, the wire-bonded ICs are subjected to a plasma-enhanced chemical vapor deposition PECVD process where silicon dioxides $S_iO_2$ vapor is deposited on the bonding wires and the IC die as well as on a leadframe or substrate. An insulating PECVD $S_iO_2$ layer of aluminum oxide or copper oxide on the bonding wires. The assembly is then encapsulated as either a molded plastic package, a grid-array package including a glob-top package, or a pin-grid array package. For a molded plastic package with a leadframe, the $S_iO_2$ layer is then removed from the leads of a molded plastic package by a media-blasting process and the leads are plated with Pb/Sn coating.

A method is provided according to the invention for packaging a semiconductor integrated circuit with insulated bonding wires. The method includes: attaching a semiconductor die to a mounting base and wire-bonding a plurality of aluminum or copper bonding wires between respective bonding pads on the semiconductor die and respective bonding fingers at the inner ends of leads of a leadframe if a lead frame is used. After wire bonding, the bonding wires are subjected to a PECVD $S_iO_2$ vapor to form a silicon dioxide layer on the package component including especially the plurality of bonding wires to thereby provide electrically-insulated bonding wires to prevent short-circuits between adjacent bonding wires of the package. For a package with a leadframe, the semiconductor die, the bonding wires, and the bonding fingers are encapsulated to expose the oxidized outer ends of the leads. The PECVD silicon dioxide on the exposed outer ends of the leads of the leadframe are removed by blasting with a media. For a grid-array package, such as a ball-grid array package or a pin-grid array package, a die is mounted to a polymer substrate and the bonding wires are attached to conductors formed on the polymer substrate. The grid-array entire assembly is then subjected to a PECVD $S_iO_2$ vapor to provide an insulation layer thereupon. For a ball-grid array package, the $S_iO_2$ on the solder ball attach pads are removed using a blasting media.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a sectional view showing a bonding wire connected between a bonding pad on an integrated-circuit die and a bonding finger of a leadframe of a molded plastic package assembly.

FIG. 2 is a sectional view showing apparatus using a silicon dioxide $S_iO_2$ layer on bonding wires and other components of the molded plastic package assembly.

FIG. 3 is a sectional view showing formation of the $S_iO_2$ layer on the aluminum bonding wire, bonding pad as well as on the die-attach pad and leads of the leadframe.

FIG. 4 is a sectional view showing encapsulation of the semiconductor die, the bonding wires, and the inner end of the bonding finger to expose the outer end of the lead of the molded plastic package assembly.

FIG. 5 is a sectional view showing apparatus for removal of the silicon dioxide on the exposed outer end of the lead of the leadframe by blasting with a media.

FIG. 6 is a sectional view showing the step of plating the exposed outer end of the lead of the leadframe of the molded plastic package assembly with a Pb/Sn coating.

FIG. 7 is a sectional view showing the step of forming the outer end of the lead of the molded plastic package assembly.

FIG. 8 is a sectional view showing a bonding wire connected between a bonding pad on an integrated-circuit die and a copper trace of a grid-array package.

FIG. 9 is a sectional view showing apparatus which uses a PECVD process for growing an insulating $S_iO_2$ layer on bonding wires of the grid-array package.

FIG. 10 is a sectional view showing formation of the $S_iO_2$ insulating layer on the grid-array assembly package.

FIG. 11 is a sectional view showing encapsulation of the semiconductor die, the bonding wires, and the inner end of the copper trace to expose the outer end of the lead grid-array package.

FIG. 12 shows apparatus which uses a blasting media for removing $S_iO_2$ from solder-ball attach pads.

FIG. 13 is a sectional view showing attachment of solder balls to the grid-array package.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

FIG. 1 shows a structure which includes singulated semiconductor integrated-circuit die 10 mounted to a suitable mounting base 12 such as a die-attach pad or a separate substrate with a layer 14 of an appropriate bonding material, such as a silver-filled epoxy material. The substrate 12 is a die-attach pad of a leadframe or, optionally, a separate thermally conductive substrate. A bonding wire 16 has one end ultrasonically bonded to a bonding pad 18 on the top surface of the integrated-circuit die 10. The top surface of the die 10 is covered with a protective oxide layer 20 having openings provided over the bonding pad 18. The other end of the bonding wire is ultrasonically bonded to a bonding finger 22 at the inner end of a lead 24 of the leadframe. The bonding wire 16 is typically made of a conductive material such as aluminum or copper, which can be oxidized to form an insulating layer on the surface of the bonding wire. The bonding pad 18 on the die is typically made of aluminum and the leadframe is typically made of copper or silver-plated copper.

FIG. 2 illustrates a PECVD process for forming an insulating $S_iO_2$ layer on the structure of FIG. 1 where the dotted arrows represent deposition of $S_iO_2$.

FIG. 3 illustrates the result of subjecting the structure of FIG. 1 to the PECVD process environment of FIG. 2. An $S_iO_2$ layer 26 is deposited on all of the components and, in particular, an insulating $S_iO_2$ layer 27 is formed on the bonding wire 16. The $S_iO_2$ layer 27 on each of a plurality of bonding wires in a package provide electrical insulation between adjacent bonding wire in order to prevent electrical short-circuits, or shorts, therebetween.

FIG. 4 illustrates a molded plastic package body 28 formed of a plastic molding compound material. The molded package body 28 encapsulates the semiconductor die 10, the insulated bonding wire 16, and the inner end of the bonding finger 22. The $S_iO_2$ layer 26 at the outer ends of the lead 24 is exposed after this encapsulation.

FIG. 5 illustrates apparatus for removal of the $S_iO_2$ layer 26 on the exposed outer end of the lead 20 of the leadframe shown in FIG. 4. A series of nozzles, typically shown as 30, are used to direct a high power jet using a media such as a mixture of water and glass beads, typically shown as 32, for blasting away the oxide layer 26 at the outer ends of the lead 24.

FIG. 6 illustrates the exposed outer end of the lead 24 having a Pb/Sn coating 34 formed thereupon. FIG. 7 illustrates the lead 24 of the molded plastic package being bent to a suitable profile, such as, for example, a gull wing configuration.

FIG. 8 illustrates a package structure for a grid-array package which includes a singulated semiconductor integrated-circuit die 40 mounted and attached to a die-attach pad portion 42 of a conductive copper layer with a layer 44 of an appropriate bonding material, such as a silver-filled epoxy material. The copper layer extends over an insulated substrate 46 formed, for example, of a polymer material, such as an epoxy or polyimide material. The copper layer includes a plurality of peripheral conductive traces, typically shown as 48. A bottom solder mask 52 extends over the lower surface of the epoxy substrate 46 with openings formed therein through which extend gold-plated conductive pads 54, 55 for connection to solder balls in a ball-grid array package. Grid-array packages also include pin-grid array packages where the pads 54, 55 are replaced with projecting pins.

A typically-illustrated bonding wire 56 has one end ultrasonically bonded to a bonding pad 58 formed on the top surface of the integrated-circuit die 40. The other end of the bonding wire 56 is ultrasonically bonded to a bonding area 60 at the inner end of the conductor area 48. The bonding wire 56 is typically made of a conductive material, such as aluminum or copper, which can be oxidized to form an insulating layer on the surface of the conductor. The bonding pad 58 is typically made of aluminum which is oxidized to form an insulating layer thereupon.

FIG. 9 illustrates a PECVD process for forming an insulating $S_iO_2$ layer on the bonding wire 56 of FIG. 8, where the dotted arrows represent $S_iO_2$ being deposited.

FIG. 10 illustrates the result of subjecting the structure of FIG. 8 to the $S_iO_2$ PECVD process of FIG. 9 to form an insulating $S_iO_2$ coating 62 on the entire structure including the bonding wire 56 to provide electrical insulation between adjacent bonding wires in order to prevent electrical short-circuits, or shorts, therebetween.

FIG. 11 illustrates a glob-top package body 64 formed of an epoxy material to encapsulate the semiconductor die 40, the insulated bonding wire 56, and the inner end of the bonding area 60 at the inner end of the conductor area 48.

FIG. 12 illustrates media blasting apparatus for removal of $S_iO_2$ material from over the pads 54, 55 using nozzles, typically shown as 70, for directing a high power jet using a media such as a mixture of water and glass bead, typically shown as 72, for exposing the solder-ball attachment pads 54, 55.

FIG. 13 illustrates attachment of solder balls 74, 75 to a glob-top package conductive pads 54, 55 of the glob-top package. It is intended that the grid-array package, such as a pin-grid array package, are provided with oxidized insulated bonding wires in accordance with the present invention.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. An improved semiconductor integrated circuit package with insulated bonding wires, comprising:

a semiconductor integrated-circuit die attached to a mounting base;

a plurality of aluminum bonding wires having respective first ends wire-bonded to respective bonding pads on the semiconductor die and having respective second ends bonded to respective bonding fingers at inner ends of leads of a leadframe;

the aluminum bonding wires having an external, exposed PECVD $S_iO_2$ insulating layer formed thereupon to thereby provide electrically-insulated bonding wires to prevent short-circuits between adjacent bonding wires;

a plastic package body which is molded around the semiconductor die, the bonding wires, and the bonding fingers, leaving the outer ends of the leads exposed outside of the plastic package body; and the leads of the leadframe also having an external PECVD $S_iO_2$ layer formed thereupon except at the exposed outer ends thereof.

2. The improved package of claim 1 wherein the semiconductor die is attached to a die-attach pad of the leadframe.

3. The improved package of claim 1 wherein the semiconductor die is attached to a separate substrate.

4. The improved package of claim 1 wherein the exposed outer ends of the leads of the leadframe are plated with a Pb/Sn coating.

5. An improved semiconductor integrated circuit package with insulated bonding wires, comprising:

a semiconductor integrated-circuit die attached to a mounting base, where the mounting base is a separate thermally conductive and electrically insulated substrate;

a plurality of bonding wires having their respective first ends bonded to respective bonding pads on the semiconductor die and having their respective second ends bonded to respective bonding fingers at inner ends of the leads of a leadframe which has an external, exposed PECVD $S_iO_2$ insulating layer formed thereupon except at the outer ends of the leads; and the bonding wires also having an external, exposed PECVD $S_iO_2$ insulating layer formed thereupon to thereby provide electrically-insulated bonding wires to prevent short-circuits between adjacent bonding wires.

6. An improved integrated-circuit grid-array package, comprising:

a semiconductor die mounted to an insulated grid-array substrate;

a plurality of bonding wires bonded at their first ends to respective bonding pads on the semiconductor die and bonded at their second ends to respective bonding fingers at inner ends of conductive traces formed on the substrate;

the bonding wires having an external, exposed PECVD $S_iO_2$ insulating layer formed thereupon to thereby provide electrically-insulated bonding wires to prevent short-circuits between adjacent bonding wires; and wherein the semiconductor die, the bonding wires, and the bonding fingers are encapsulated with a packaging material.

7. The improved package of claim 6 wherein the package includes gold-plated solder-ball pads on the substrate of a ball-grid array package.

8. The improved package of claim 6 wherein the substrate is a polymer substrate.

* * * * *